(12) United States Patent
Peiler

(10) Patent No.: US 8,441,028 B2
(45) Date of Patent: *May 14, 2013

(54) LIGHT EMITTING DEVICE INCLUDING A LIGHTING EMITTING CHIP ATTACHED ON A HEAT CONDUCTIVE LAYER VIA AN UNDERCOATING AND METHOD OF MANUFACTURING THE LIGHT EMITTING DEVICE

(75) Inventor: Kimberly Peiler, Canton, MI (US)

(73) Assignee: Osram Opto Semiconductors GmbH, Regensburg (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/488,094

(22) Filed: Jun. 4, 2012

(65) Prior Publication Data
US 2012/0235202 A1    Sep. 20, 2012

Related U.S. Application Data

(63) Continuation of application No. 12/491,180, filed on Jun. 24, 2009, now Pat. No. 8,198,646.

(60) Provisional application No. 61/132,888, filed on Jun. 24, 2008.

(51) Int. Cl.
H01L 33/58 (2010.01)
(52) U.S. Cl.
USPC ............................................. 257/98

(58) Field of Classification Search ............. 257/300, 257/98–100, 343, 432–433
See application file for complete search history.

(56) References Cited

U.S. PATENT DOCUMENTS

| | | | |
|---|---|---|---|
| 7,676,915 B2 * | 3/2010 | Ter-Hovhannissian | 29/840 |
| 2003/0116830 A1 | 6/2003 | Haines | |
| 2003/0189246 A1 | 10/2003 | Iwaki et al. | |
| 2003/0227024 A1 * | 12/2003 | Yoshii et al. | 257/99 |
| 2004/0036081 A1 * | 2/2004 | Okazaki | 257/99 |
| 2004/0266065 A1 | 12/2004 | Zhang et al. | |
| 2007/0164302 A1 * | 7/2007 | Tanda | 257/98 |
| 2008/0079145 A1 | 4/2008 | Tschirbs et al. | |
| 2008/0191236 A1 | 8/2008 | De Graaf et al. | |
| 2009/0095971 A1 | 4/2009 | Glovatsky et al. | |
| 2009/0278162 A1 | 11/2009 | Wang et al. | |
| 2011/0175132 A1 | 7/2011 | Kwon et al. | |

* cited by examiner

Primary Examiner — Nathan Ha
(74) Attorney, Agent, or Firm — Cozen O'Connor

(57) ABSTRACT

A light emitting device comprising a heat sink, a dielectric layer arranged on the heat sink, a heat conductive layer arranged on the dielectric layer, an undercoating arranged on at least a part of the heat conductive layer, and a light emitting chip attached to the heat conductive layer by means of the undercoating.

12 Claims, 3 Drawing Sheets

LIGHT EMITTING DEVICE INCLUDING A LIGHTING EMITTING CHIP ATTACHED ON A HEAT CONDUCTIVE LAYER VIA AN UNDERCOATING AND METHOD OF MANUFACTURING THE LIGHT EMITTING DEVICE

CROSS-REFERENCE TO RELATED APPLICATIONS

This patent application is a Continuation of U.S. patent application Ser. No. 12/491,180 filed Jun. 24, 2009, which claims priority to U.S. Provisional Patent Application Ser. No. 61/132,888 filed Jun. 24, 2008, the disclosure contents of which are hereby incorporated by reference.

BACKGROUND OF THE INVENTION

1. Field of the Invention

The invention relates to a light emitting device comprising a light emitting chip attached on a heat conductive layer by means of an undercoating.

2. Description of the Related Art

One problem of the existing light emitting devices is the high thermal resistance from the device to the ambient air. This is due to the stack-up of the device like, for example, the use of a printed circuit board or a lead frame.

Since heat conduction of the devices is directly related to efficiency and life time of the light emitting devices, it is desirable to produce devices with good heat conduction.

In addition, the complexity of light emitting devices comprising a printed circuit board is very high so reducing this is an additional goal of some embodiments of this invention.

Most of the light emitting devices comprise an LED chip which is attached to a leadframe. The leadframe is usually metal and is encased in a plastic or ceramic package. This package is normally made of a plastic or ceramic material. These materials have a low thermal conductivity. In addition, the packaged chip can be attached to the board by a glue or solder and the board is attached to the heat sink by a glue, thermal interface like a paste, grease or an epoxid or another adhesive. This glue and the adhesive materials also have a low thermal conductivity. Furthermore, the material of the printed circuit board which is typically an FR4-material (woven glass and epoxy) or a CEM-material (cotton paper and epoxy or woven glass and epoxy), both have a low thermal conductivity.

The heat which is produced during operating the light emitting device by the chip has to pass the package into the board substrate and the thermal interface material or air between the board and the heat sink until it reaches the heat sink and can be dissipated to the ambient.

SUMMARY OF THE INVENTION

One embodiment of the invention is directed to a light emitting device comprising a heat sink, a dielectric layer arranged on the heat sink, a heat conductive layer arranged on the dielectric layer, an undercoating arranged on at least a part of the heat conductive layer, and a light emitting chip attached on the heat conductive layer by means of the undercoating. The undercoating can be also electrically conductive and part of a circuit.

This light emitting device has a better heat conduction and thermal resistance than a light emitting device comprising a leadframe or a printed circuit board. Here, the light emitting chip is directly attached to a heat conductive layer by means of an undercoating. So the energy which is produced during operating the light emitting device can easily be transferred from the chip to the heat conductive layer via the thermally conductive undercoating. Because of the good thermal conductivity of the heat conductive layer, the heat is quickly transferred away from the chip to the dielectric layer and from there to the heat sink. Due to the efficient heat transfer of the device, the light efficiency and the life time of the device is increased. Additionally, the complexity of some embodiments of the device is reduced, because these devices do not comprise a leadframe or a printed circuit board.

In another embodiment, the heat conductive layer comprises a contact point in a distance to the undercoating.

The surface of the contact point can be enlarged compared to the surface of the heat conductive layer surrounding the contact point so that energy which is applied to the contact point is absorbed more efficiently and faster than if the energy would be applied directly to the surface of the heat conductive layer. Furthermore it is possible that the contact point comprises an absorption material, which has a better light absorption than the heat conductive layer.

This contact point makes it possible to produce a light emitting device in a new way. This contact point is formed in a way that it can absorb thermal energy more easily and faster than the surface of the heat conducting layer. If in a production step heat is applied to this contact point the thermal energy is quickly absorbed. The increased absorbance of the energy at the contact points can be based on the geometric form of the contact points or in the material the contact point is made of.

In another embodiment, the thermal conductivity of the heat conductive layer is greater than 350 W/m*K.

Because of the good thermal conductivity of the heat conductive layer, the heat which is produced by the chip during operation can be quickly transported away from the chip into the direction of the heat sink. Further more because of the high heat conductivity of the heat conductive layer the heat, which is transferred from the chip to the heat conductive layer is quickly distributed within the whole heat conductive layer thereby avoiding an accumulation of the heat in the area where the heat conductive layer is in contact with the undercoating. Therefore the thermal conductivity of the light emitting device according to some embodiments of the invention is improved compared to conventional devices. Additionally, the high conductivity of the heat conductive layer makes it possible to produce the device in a new way. Energy which is applied to the conductive layer, for example to the contact points or to other points in a distance of the undercoating, can be quickly transferred from the contact point where the energy is applied to the undercoating. The heat conductive layer could comprise copper for example.

In another embodiment, the thermal conductivity of the heat conductive layer is greater than the thermal conductivity of the dielectric layer.

Because of the greater thermal conductivity of the heat conductive layer, the heat which is applied to the conductive layer is transported within the heat conductive layer towards the undercoating in a quicker way than transported from the heat conductive layer through the dielectric layer to the heat sink. Due to that the whole heat conductive layer is heated before the energy is transferred through the dielectric layer. The dielectric layer could be made of an inorganic material like a oxide or of a polymeric organic material like a plastic. This makes it possible to get a uniform or nearly uniform dispersion of the thermal energy in the heat conductive layer.

In another embodiment, the contact point has a geometric form that increases the absorption of the thermal energy.

The geometric form can be, for example, tines, waves or groovings. The surfaces of the contact points can be enlarged compared to the surface of the heat conductive layer surrounding the contact point so that energy which is applied to the contact point is absorbed more efficiently and faster than if the energy would be applied directly to the surface of the heat conductive layer.

In another embodiment, the contact point comprises an absorption material that increases the absorption of light.

If the energy is applied to the contact point, for example by a laser, the absorption material of the contact point could be matched to the wave length of the laser light. Thereby, the absorption of the energy at the contact point is much better than the absorption of the other surface of the heat conductive layer surrounding the contact point. Hereby, the absorption material can be located on the top of the contact points or distributed in the whole contact point area. This absorption material makes it possible to heat up the heat conductive layer efficiently by a laser system. For the absorption material for example carbon black could be used.

In another embodiment, the contact point and the heat conductive layer contain the same heat conductive material.

It is possible to form a contact point directly in the heat conductive layer. For example it is possible to only enlarge the surface of the heat conductive layer in the area of the contact point. Furthermore, it is possible to apply an absorption material onto the surface of the heat conductive layer in the area of the contact point. It should be ensured that also the contact point has a high heat conductivity, that the energy which is applied to the contact point is quickly transferred from the contact point to the heat conductive layer.

In another embodiment, the light emitting device comprises a plurality of contact points.

A "plurality" means in this case more than one contact point. These contact points are preferably arranged symmetrically around the undercoating for example in a circular or rectangular arrangement. Symmetrically means in this case that the contact points are arranged in the same distance to the undercoating, each on an opposite side of the undercoating. This makes it possible to heat up the heat conductive layer uniformly by simultaneously applying heat to the contact points, which are located on opposite sides of the undercoating.

In another embodiment, the undercoating comprises a solder material.

The solder material can be used to attach the chip to the heat conductive layer. Also, the solder material can have a good heat conductivity for transporting the heat from the chip to the heat conductive layer. Furthermore, the solder material can serve as an electric contact between the chip and the heat conductive layer. The solder material could be softened by a reflow soldering process. As solder material a lead free solder can be used comprising an alloy of tin, silver and zinc.

In another embodiment, the melting point of the undercoating is lower than the melting point of the heat conductive layer.

It is possible to soften the undercoating without applying energy directly to the undercoating. Energy can be applied to the heat conductive layer, for example via the contact points, and then could be transferred from the contact points to the heat conductive layer and further to the undercoating. Thereby, the undercoating could be softened by the heat, without softening the heat conductive layer itself.

Apart from the light emitting device, a method of manufacturing a light emitting device is disclosed.

A variant of the method of manufacturing a light emitting device comprises the method steps of providing a heat sink in a method step A), applying a dielectric layer to the heat sink, as step B), arranging a heat conductive layer on the dielectric layer, as step C), applying an undercoating to a part of the heat conductive layer, as step D), positioning a chip on the undercoating, as step E), applying energy to the heat conductive layer at a distance to the chip, whereby the heat conductive layer is heated and the heat is transported through the heat conductive layer to the undercoating, such that the undercoating is softened, as step F) and in a step G), hardening the undercoating, thereby attaching the chip to the heat conductive layer.

During this manufacturing method, the undercoating is softened without applying energy directly to the undercoating. The energy is applied to the heat conductive layer and than transported in the heat conductive layer to the undercoating. If the energy is applied in a distance to the undercoating and therefore in a distance to the chip there is no danger that the chip could be damaged by the energy. Even by applying a high energy, the energy is distributed through the whole heat conductive layer so it is more uniform and curbed when it reaches the undercoating. So in this method, the undercoating is softened in a smooth way. For the undercoating, a material could be used which comprises a solder material. The chip is mechanically connected to the heat conductive layer via the undercoating in an electro conductive and thermo conductive way. Because of the lower heat conductivity of the dielectric layer, the heat which is applied to the heat conductive layer does not heat up the heat sink so fast, so that less energy is necessary for attaching the chip to the heat conductive layer by softening the undercoating.

In a preferred variant of the method of the invention, the method additionally comprises a further method step before step F), forming a contact point on the heat conductive layer at a distance from the undercoating as step H), wherein the energy in step F) is applied to the heat conductive layer over the contact point.

The contact points should be formed in a distance which is large enough that the undercoating and the chip are not being damaged when the energy is applied to the contact point. The contact point is formed in a way that the absorbance of energy is increased within this contact point compared to the surrounding heat conductive layer. When the energy is applied to the contact points, it is absorbed by the contact points transfer through the heat conductive layer to the undercoating so the undercoating could be softened without applying energy directly to the undercoating.

In a variant of the method, a laser is used in step F) for applying the energy.

The contact points can comprise an absorption material which can be a pigmental material for example. Hereby, the absorption maximum of the absorption material can be matched to the laser wavelength. Due to that a high quantity of absorption can be reached without distributing an absorption material over the whole surface of the heat conductive layer. The absorption material can be located only on the surface of the contact point, for example by printing it onto the surface. But it can also be distributed through the whole contact point, for example by mixing the absorption material with a material the contact point is made of. For example carbon black could be used as pigment material.

In another variant of the method, a soldering rod is used in step F) for applying the energy.

In this case even solder temperatures could be applied to the contact points which would destroy the chip if these temperatures would be applied directly to the undercoating. Because the energy which is applied to the contact points of the surface of the heat conductive layer in a distance to the chip is distributed through the whole heat conductive layer before it reaches the undercoating. The solder process can be, for example, hotbar soldering, robotic tip soldering or hand soldering. With a large hot bar many points in a line could be selective soldered at once. With robotic tip soldering one or more points touching a board could be soldered a one time.

In another variant of the method in step H), a plurality of contact points is formed and the energy in step F) is simultaneously applied to all contact points.

If the light emitting device comprises more than one contact point the energy applied to these contact points should be applied to these contact points at the same time. In this variant, a higher uniformity of heat distribution within the heat conductive layer and therefore a higher uniformity of softening the undercoating can be reached. A high uniformity of heat distribution during the softening of the undercoating is important to avoid a shift of the chip, which is located on the undercoating. Furthermore, it is important to manufacture a light emitting device having a uniform thickness of the undercoating beneath the light emitting chip.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE PREFERRED EMBODIMENTS

Figure 1:
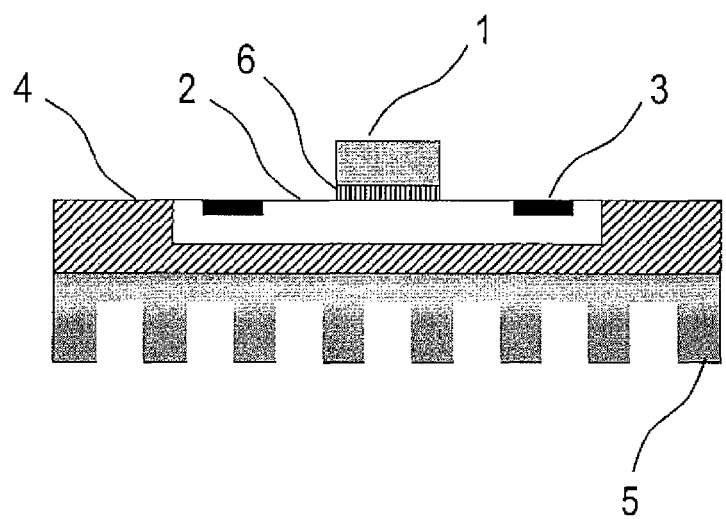
FIG. 1 shows a schematic cross-section of one embodiment of the light emitting device.

FIG. 1 shows schematically the cross-section of a light emitting device. The light emitting device comprises a heat sink 5 with an enlarged surface area on the underside of the device where the heat can be transferred to the surrounding area. The heat sink 5 is made out of material with good heat conductivity for example a metal like aluminium or copper. On the heat sink 5 a dielectric layer 4 is arranged. This dielectric layer 4 electrically insulates the heat sink 5 from the layers which are arranged on the dielectric layer 4 opposite to the heat sink 5. The dielectric layer 4 could be made of an anorganic material like a metal oxide or of a polymeric organic material like a plastic, for example T-Iam SS 1KA04®.

The dielectric layer 4 is furthermore thermo conductive in order to transfer heat from the layers, which are located on the dielectric layer 4 to the heat sink 5. The heat conductive layer 2 is arranged on the dielectric layer 4. The heat conductive layer 2 comprises material with good heat conductivity, for example copper or graphite. In the middle of the heat conductive layer 2, the light emitting chip 1 is located, which is attached to the heat conductive layer 2 by means of the undercoating 6. The chip 1 is attached to the heat conductive layer 2 by the undercoating in a mechanical and heat conducting way. It is possible that the chip is also attached to the undercoating 6 in an electrically conducting way. Also the heat conductive layer can be a part of a circuit. In a distance to the undercoating 6, there are two contact points 3 located in the heat conductive layer 2, both contact points having the same distance to the undercoating 6. These contact points 3 makes it possible to apply heat to the device, which is then distributed through the whole heat conductive layer 2. The contact points 3 are also made of a high thermal conductive material like copper or graphite. The chip 1 is electrically connected through the heat conductive layer 2. The heat conductive layer 2 can be part of a circuit and can be made of copper.

Figure 2:
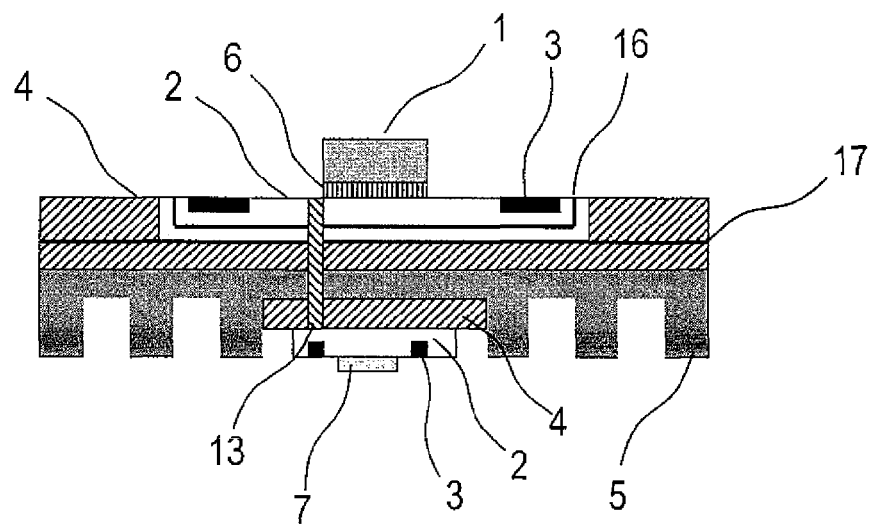
FIG. 2 shows a schematic cross-section of another embodiment of the light emitting device.

FIG. 2 shows a cross-section of another embodiment of the light emitting device. This embodiment comprises, additionally to the one which is shown in FIG. 1, a circuit 7. This circuit 7 is located on the backside of the light emitting device and can be, for example, a driver circuit. The circuit 7 is located on the opposite side of the heat sink 5 where the chip 1 is located. The circuit 7 is attached to another heat conductive layer 2 which also comprises two contact points 3. The second heat conductive layer 2 is also attached to a dielectric layer 4. The circuit 7 can be electrically contacted with the chip 1 (not shown in the figure). The chip 1 could be connected to the circuit 7 via a hole or via a rivet through the heat sink 5.

The advantage of locating the circuit 7 on the other side of the heat sink 5 is that the chip 1 and the circuit 7 are not interfering with each other in a visual, aesthetic or thermal way. Also, the chip 1 and the circuit 7 could be attached to the device in the production process in a way without influencing the other device by applying heat to the surface. The heat of the circuit 7 can also be transported through the high conductive layer 2 to the heat sink 5. The device comprises a first circuit layer 16 in the heat conductive layer 2 and a second circuit layer 17. The circuit layers 16/17 are mad of an electrically conductive material, for example copper. The circuit layers 16/17 could be used for the electrically contact for the chip 1 and the circuit 7. There is an electric pass-through 13 which connects the first circuit 16 with the second circuit layer 17 and the two heat conductive layers 2. Thereby there is an electrically connection between the chip 1 and the circuit 7. Instead of the electric pass-through 13 the electrical connection could go around the heat sink 5 with a wire for example. Another alternative to the electric pass-through 13 is an isolated wire through the heat sink 5.There are also embodiments possible, where the circuit 7 is on the same side of the heat sink 5 as the chip 1.

Figure 3:
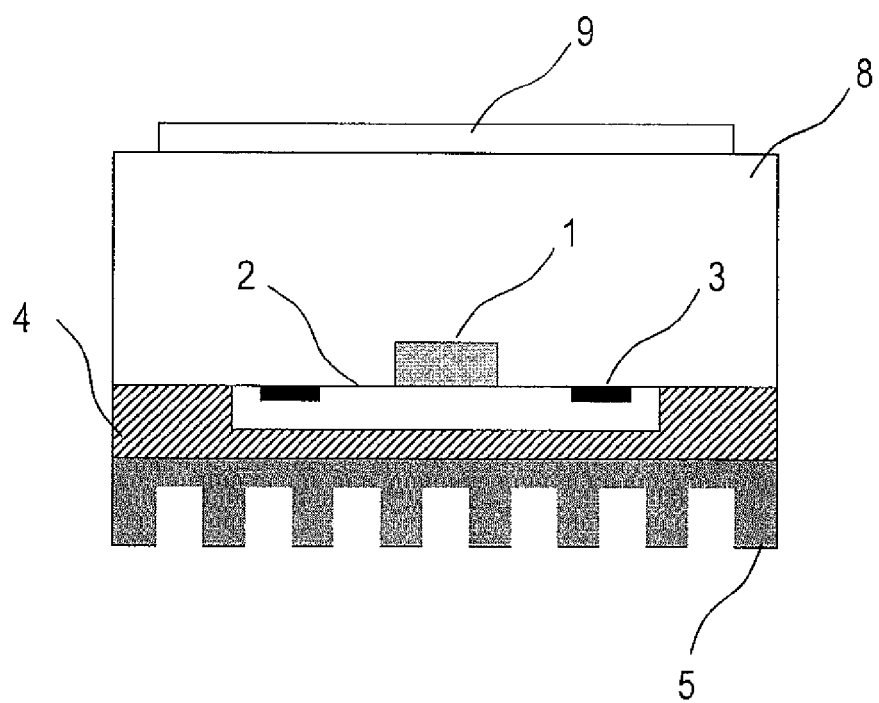
FIG. 3 shows a schematic cross-section of another embodiment of the light emitting device including a casing surrounding the light emitting chip.

FIG. 3 depicts a cross-section of another embodiment of the light emitting device. This embodiment further comprises, compared to the embodiment which is shown in FIG. 1, a casing 8 including an optic element 9, which could be a lens or a disperse-plate for example. The casing 8 could be made of a material like a gel, which can be index matched to the optic element 9. The material is chosen in a way, that the refraction index of the casing 8 is similar to this of the optic element 9, to reduce the reflection at the interface of both materials. In another embodiment, the casing 8 can also be only a frame which carries the optic 9 so that between the chip 1 and the optic 9 there is only air. The optic element 9 can be used to manipulate the radiation emitted from the chip 1.

Figure 4:
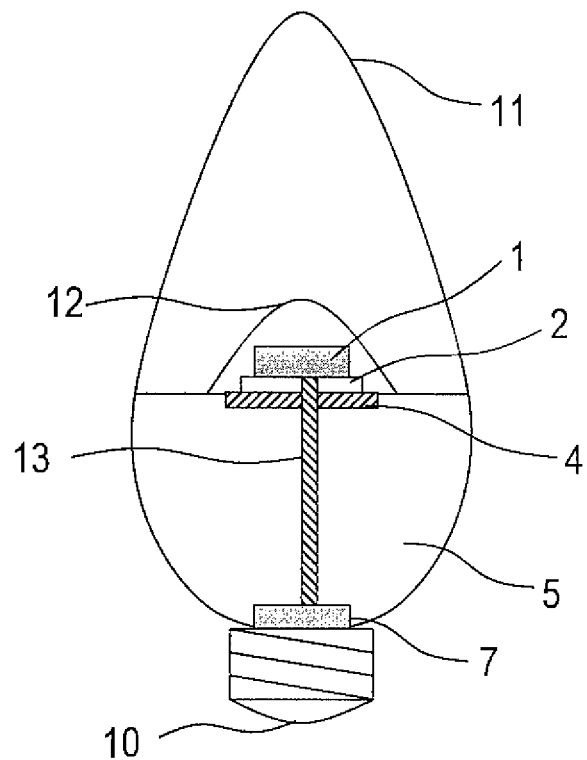
FIG. 4 shows a schematic cross-section of another embodiment of the light emitting device.

FIG. 4 shows a cross-section of a further embodiment of the light emitting device in form of an electric bulb. The bulb comprises a heat sink 5 which forms the lower part of the body; the upper part of the body is formed by a curved lens 11. In the middle of the bulb, the chip 1 is located covered by an optic element 12. The chip 1 is arranged on the heat conductive layer 2, also connected to the circuit 7, the heat conductive layer 2 is arranged on the dielectric layer 4 which electrical isolates the heat conductive layer 2 from the heat sink 5. At the lower end of the heat sink 5 there is a circuit 7 which is electrically contacted to the chip 1 through an electric pass through 13. The device also comprises a bulb connection 10 on the bottom which can be connected to the circuit 7.

Figure 5:
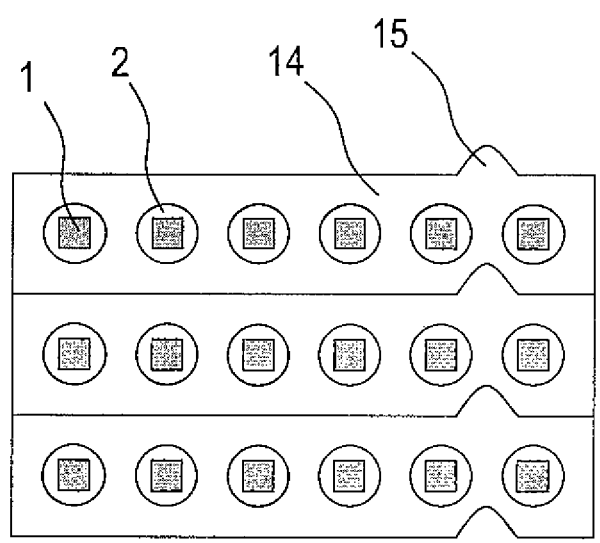
FIG. 5 shows schematically a stack modular system comprising a plurality of the light emitting devices of the invention.

FIG. 5 schematically shows a cross-section of a stackable modular system. In FIG. 5 are three modules 14 shown, which are stacked on top of each other and are connected via a connection part 15. The modules 14 can be electrical connected via the connection part 15. Each stackable module 14 comprises a plurality of chips 1. These chips 1 could be chips 1 like the one shown in FIG. 1 for example. Hereby, the body of the stackable modules 14 can be the heat sink 5 or an additional casing. Each of the chips 1 can be located on a single separate heat conductive layer 2 or each stackable module 14 can have one large heat conductive layer 2. On the backside of the stackable module 14, there could be located a circuit 7 which can control all chips 1 of one module 14. The chips can emit the same or different coloured lights such as red, green, blue, white or pink. In the case of light emitting device with multiple emitters, a combination of coloured emitters can be arranged in one module in order to create tuneable colours or add infrared content to the spectrum of the light engine. Separate chips 1 in the module 14 could be addressed separately to control the light output of individual chips 1.

Spectrum converters such as phosphors could be applied over the chip 1 or the optic elements 9 or 12. In addition the converter material also could be included in the material of the casing 8, the lens 11 or the optic elements 9 or 12.

Optic elements 9/12 may be placed above the chips 1 to change the radiation characteristics of the chip 1 and I or to increase the optical out coupling. These optic elements could be arranged over the chip 1 with or without an air gap between the respective chips 1 and the optic elements.

Light emitting devices of this invention could be designed to stack together in a luminary design. The device could comprise modules in form of hexagons and could form a "honeycomb".

The above description of the invention using the exemplary embodiments is not to be understood to mean a restriction of the invention thereto. Rather, the inventive concept set out in claims 1 and 15 can be applied for a large number of very different designs. In particular, the invention also covers all combinations of the features cited in the exemplary embodiments and in the rest of the description, even if these combinations are not the subject matter of a patent claim.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, it is expressly intended that all combinations of those elements and/or method steps which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A light emitting device comprising:
   a heat sink;
   a dielectric layer arranged on the heat sink;
   a heat conductive layer arranged on the dielectric layer;
   an undercoating arranged on at least a part of the heat conductive layer;
   a light emitting chip attached to the heat conductive layer by the undercoating;
   an optical element arranged in a beam path of the light emitting chip; and
   a circuit arranged on a side of the heat sink which faces away from the light emitting chip.

2. The light emitting device according to claim 1, wherein the heat conductive layer comprises a contact point at a distance to the undercoating.

3. The light emitting device according to claim 1, wherein the thermal conductivity of the heat conductive layer is greater than 350 W/m*K.

4. The light emitting device according to claim 1, wherein a thermal conductivity of the heat conductive layer is greater than a thermal conductivity of the dielectric layer.

5. The light emitting device according to claim 2, wherein the contact point has a geometric form comprising tines, waves or groovings so that a surface of the contact point is enlarged compared to a surface of the heat conductive layer and an absorption of thermal energy is increased.

6. The light emitting device according to claim 2, wherein the contact point comprises an absorption material that increases the absorption of light.

7. The light emitting device according to claim 2, wherein the contact point and the heat conductive layer contain the same heat conductive material.

8. The light emitting device according to claim 2, wherein the light emitting device comprises a plurality of contact points.

9. The light emitting device according to claim 1, wherein the undercoating comprises a solder material.

10. The light emitting device according to claim 1, wherein a melting point of the undercoating is lower than a melting point of the conductive layer.

11. The light emitting device according to claim 1, wherein the light emitting chip is electrically conductively connected to at least a part of the heat conductive layer.

12. The light emitting device according to claim 1, wherein the light emitting chip and the heat conductive layer are electrically conductively connected to the circuit by an electric pass-through.

* * * * *